United States Patent
Pickett et al.

(10) Patent No.: US 9,214,231 B2
(45) Date of Patent: Dec. 15, 2015

(54) CROSSBAR MEMORY TO PROVIDE CONTENT ADDRESSABLE FUNCTIONALITY

(71) Applicant: Hewlett-Packard Development Company, L.P., Houston, TX (US)

(72) Inventors: Matthew D Pickett, San Francisco, CA (US); Frederick Perner, Santa Barbara, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 372 days.

(21) Appl. No.: 13/755,667

(22) Filed: Jan. 31, 2013

(65) Prior Publication Data

US 2014/0215143 A1 Jul. 31, 2014

(51) Int. Cl.
*G11C 15/00* (2006.01)
*G11C 13/00* (2006.01)
*G11C 15/04* (2006.01)

(52) U.S. Cl.
CPC ............ *G11C 15/00* (2013.01); *G11C 13/0007* (2013.01); *G11C 15/046* (2013.01); *G11C 2213/77* (2013.01)

(58) Field of Classification Search
CPC ..... G11C 15/00; G11C 15/04; H04L 45/7457
See application file for complete search history.

(56) References Cited

U.S. PATENT DOCUMENTS

| | | | |
|---|---|---|---|
| 6,952,358 B2 | 10/2005 | Snider | |
| 7,619,911 B2 | 11/2009 | Hanzawa et al. | |
| 7,782,646 B2 | 8/2010 | Lam et al. | |
| 7,848,128 B2 | 12/2010 | Arsovski et al. | |
| 8,320,148 B1 * | 11/2012 | Derhacobian | 365/49.18 |
| 8,659,926 B1 * | 2/2014 | Derhacobian | 365/49.18 |
| 8,984,217 B2 * | 3/2015 | Shen et al. | 711/108 |
| 2009/0141527 A1 * | 6/2009 | Arsovski et al. | 365/49.17 |
| 2011/0013442 A1 | 1/2011 | Akerib et al. | |
| 2012/0054426 A1 * | 3/2012 | Shen et al. | 711/108 |

OTHER PUBLICATIONS

Eshraghian, K. et al., Memristor MOS Content Addressable Memory (MCAM): Hybrid Architecture for Future High Performance Search Engines, (Research Paper), IEEE Transactions on Very Large Scale Integration (VLSI) Systems, Aug. 2011, pp. 1407-1417, vol. 19, No. 8.

* cited by examiner

*Primary Examiner* — Han Yang
*Assistant Examiner* — Xiaochun L Chen
(74) *Attorney, Agent, or Firm* — Hewlett-Packard Patent Department (57) ABSTRACT

Examples disclose a crossbar memory with a first crossbar to write data values corresponding to a word. The crossbar memory further comprises a second crossbar, substantially parallel to the first crossbar, to receive voltage for activation of data values across the second crossbar. Additionally, the examples of the crossbar memory provide an output line that interconnects with the crossbars at junctions, to read the data values at the junctions. Further, the examples of the crossbar memory provide a logic module to determine whether the second crossbar data values correspond to the word written in the first crossbar.

12 Claims, 5 Drawing Sheets

CROSSBAR MEMORY TO PROVIDE CONTENT ADDRESSABLE FUNCTIONALITY

BACKGROUND

A standard memory allocates a specified location to store one or more data values corresponding to a word. When the location is specified as input, the standard memory returns the data values stored at those specified location(s).

BRIEF DESCRIPTION OF THE DRAWINGS

In the accompanying drawings, like numerals refer to like components or blocks. The following detailed description references the drawings, wherein.

DETAILED DESCRIPTION

A standard memory or crossbar memory as referred to herein, may be limited in that it may provide data that needs to be stored at specified locations. Additionally, the crossbar memory may be less efficient and slower than other types of memories (such as a content addressable memory) in obtaining the data stored at the specified location. In contrast to crossbar memory, a content addressable memory (CAM) inputs a data value (such as a word) and returns the specific location in which that particular data value occurs. Although the CAM may be more efficient than the crossbar memory, the CAM consumes far greater power and cost per bit, as the CAM compares the data values at each bit, and may use more circuitry at the bit level to read each bit.

To address these issues, examples disclosed herein provide a method to provide content addressable functionality from an existing crossbar memory structure. The method writes data values corresponding to a word across a first crossbar. In this regard, the first crossbar is used as a reference against other crossbars that may be tested to determine whether the word is stored in the other crossbars. This further enables the crossbar memory to return the address of the other crossbars that may contain the word.

Additionally, the method discloses applying a voltage across a second crossbar, which is substantially parallel to the first crossbar for activation of the data values, and determining whether the data values across the second crossbar correspond to the data values across the first crossbar. In this example, each crossbar under test is analyzed to determine whether the data values correspond to the data values that represent the word. This provides an efficient method as it utilizes existing memory structure without placing additional circuitry at each bit level to provide the content addressable functionality.

In another example, if the data values among both crossbars correspond, a controller returns an address of the crossbar that contains the corresponding data values. This indicates the second crossbar may include the word written in data values across the first crossbar.

In a further example, the method includes writing binary data values that are a bitwise inverse to the data values that represent the word. This further provides a secure function to test each crossbar by preventing a possible false negative.

In summary, examples disclosed herein disclose a more efficient memory that provides the content addressable functionality without additional circuitry and cost.

Figure 1:
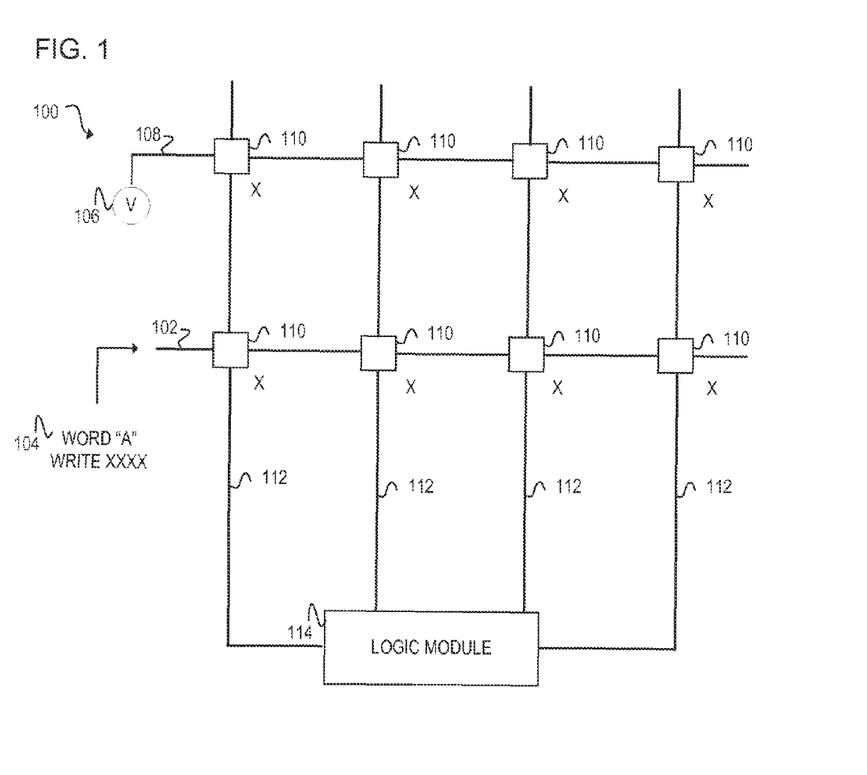
FIG. 1 is a block diagram of an example crossbar memory including a first crossbar to write data values corresponding to word at junctions, a second crossbar to receive voltage for activation of data values at the junctions, and a logic module to read the data values at an output line.

Referring now to the figures, FIG. 1 is a block diagram of an example crossbar memory 100. The crossbar memory 100 includes a first crossbar 102 to write data values corresponding to a word 104 at junctions 110. The crossbar bar memory 100 further includes a second crossbar 108 to receive a voltage 106 for activation of data values at the junctions 110 across the second crossbar 108. A logic module 114 is connected at output lines 112 to read the data values and determine whether the data values across the second crossbar 108 correspond to the data values written in the first crossbar 102. The crossbar memory 100 includes multiple inputs (i.e., crossbars 102 and 108) connecting to multiple outputs (i.e., output lines 112) in a matrix manner. The intersection of each crossbar 102 or 108 includes a junction 110. Each junction 110 includes an electrical device, such as a switch for storing a data value. Examples of the crossbar memory 100 include a programmable read-only memory, erasable read-only programmable memory, one-time programmable non-volatile memory, digital memory, random access memory, or other type of memory cable of connecting multiple inputs to multiple outputs at the junctions 110 to store data values.

The first crossbar 102 is considered an input in the crossbar memory 100 and as such, includes a wire capable of carrying an electrical charge to each of the junctions 110. The electrical charge across the first crossbar 102 is capable of writing a data value into each junction 110 across the first crossbar 102. Additionally the values as written into each junction 110, enables the first crossbar 102 to operate as a reference crossbar to other crossbars which may be analyzed or tested. Although FIG. 1 depicts the crossbars 102 and 108 as horizontal, examples should not be limited to this illustration as the crossbars 102 and 108 may be diagonal.

The data values corresponding to a word 104 are written across the first crossbar 102 by applying voltage by a voltage source 106. Data values, as described herein, refers to place-value notations representing or encoding units of text such as characters or words as data values. As such, examples of the data values may include ASCII, hexadecimal, octadecimal, binary, bytes, bits, or other data values that represent units of text. For example, consider the letter "a," which may include the binary data values of "01100001." In this example the letter "a," may be converted to the binary data values including 0s and 1s and as such, each of these bits are written into the first crossbar 102 by applying voltage. Each of the data values are represented by an "X" at each junction 110, thus in the previous example, each data value of "X" would include a "0," or "1."

The second crossbar 108 is substantially parallel to the first crossbar 102 to form the matrix manner of the crossbar memory 100. As such, the crossbars 102 and 108 are considered multiple inputs in the cross-bar memory 100 interconnecting by multiple output lines 112. Substantially parallel, as described herein, refers to the possibility of minor deviations of the parallel structure as manufacturing tolerances may vary, etc. The second crossbar 108 is a wire capable of carrying electrical charges to the junctions 110 across the second crossbar 108. The voltage source 106 applies a voltage across the second crossbar 108 to activate each of the data values in the junctions 110. Activating each of the data values in the junctions 110 across the second crossbar 108 enables an analysis of the crossbar 108 to determine whether the data values correspond to the data values across the first crossbar 102.

The junctions 110 are the intersections between the crossbars 102 and 108 and the output lines 112. The junctions 110 operate to store or activate a bit of data when voltage 106 is applied across the crossbars 102 and 108. These junctions 110 are considered fuses that are blown or opened using a higher magnitude of voltage and read using a lower magnitude of voltage. The reason is the activation of the data values stored in each junction 110 takes a lesser magnitude of voltage than to write data values to each junction. Writing the data values may consist of changing a state of the junction (e.g., from 0 to 1) which takes a higher magnitude of voltage. In another implementation, each of the junctions 110 may include a memristor to store an electrical charge that corresponds to a data value. For example, the memristor may store an electrical charge so when voltage 106 is applied the second crossbar, an electric current proportional to the stored electrical charge is read by the output line 112.

The output lines 112 intersect each of the crossbars 102 and 108 at the junctions 110. When voltage is applied to write data values to the first crossbar 102 and applied to activate data values across the second crossbar 108, the output lines 112 read the current from the junctions 110. In one implementation, the output lines 112 are substantially parallel to one another and perpendicularly intersect each of the crossbars 102 and 108.

The logic module 114 determines whether the data values activated across the second crossbar 108 correspond to the data values written into the first crossbar 102. Correspondence of the data values across the crossbars 102 and 108 signals there may be an associated word stored at the location of the second crossbar 108. The logic module 114 aggregates the output of the junctions 110 from both crossbars 102 and 108 through each of the output lines 112. In this implementation, the logic module 114 tracks the output from each output line 112 to determine whether the junctions 110 on each output line 112 correspond to one another.

Figure 2:
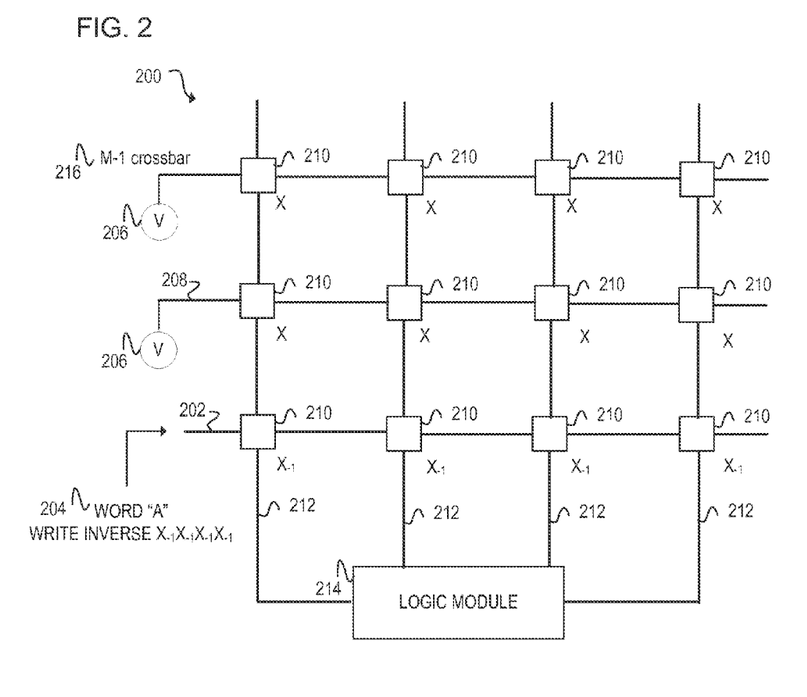
FIG. 2 is a block diagram of an example crossbar memory including m number of crossbars for activation of data values through m−1 number of crossbars, the example crossbar memory further includes a first crossbar that contains binary data values that are bitwise inverse to data values corresponding to the word.

FIG. 2 is a block diagram of an example crossbar memory 200 including m number of crossbars for activation of data values through m−1 number of crossbars 216. The example crossbar memory 200 further includes a first crossbar 202 that contains binary data values that are bitwise inverse to data values corresponding to a word 204. The second crossbar 208 and the m−1 crossbar 216 activate the data values across each of its junctions 210 through voltage source 206. The second crossbar 208 and the m−1 crossbar 216 are activated in a sequential manner for analysis to the first crossbar 202. For example, the number of crossbars is represented by m, yet since the first crossbar 202 is used as the reference of data values, each of the other crossbars 206 and 216 activated are represented by m−1. The crossbar memory 200, the first crossbar 202, the second crossbar 208, the voltage source 206, the junctions 210, the output lines 212, and the logic module 214 may be similar in structure and functionality to the crossbar memory 100, the first crossbar 102, the second crossbar 108, the voltage source 106, the junctions 110, the output lines 112, and the logic module 114 as in FIG. 1.

The inverse bits of data corresponding to the word 204 are written across the first crossbar 202 at each junction 210. Each of the binary data values that are bitwise inverse are represented by an "$X_{-1}$," across the first crossbar 202 junctions. For example, the word "a," may have corresponding binary data values of "01100001," as such, the bitwise inverse of these data values include, "10011110," which is written across the first crossbar 202. Using the bitwise inverse of the data values corresponding to the word enables the logic module 214 to obtain aggregated data values from the junctions 210 while preventing a false positive.

The m−1 crossbar 216 is substantially parallel to the first and the second crossbars 202 and 208, respectively. As such, the m−1 crossbar 216 represents an additional input interconnected by output lines 212, creating an additional row in the matrix of the crossbar memory 200. The m−1 crossbar 216 includes a wire capable of carrying an electrical charge from the voltage source 206 to each of the junctions 210 across the crossbar 216. The electrical charge from the voltage source 206 activates each of the data values of "X" across the junctions 210. Activating each of the data values across the m−1 crossbar 216 enables an analysis of crossbar 216. The analysis across the m−1 crossbar 216 includes determining whether the data values of "X," correspond to the data values of "$X_{-1}$." In this implementation, the crossbar memory 200 takes m−1 cycles to activate each of the m−1 crossbars for analysis, assuming the first crossbar 202 is used as a reference with data values written to the junctions 210. Further, each of the crossbars 208 and 216 under analysis may be read through the output lines 212.

Figure 3:
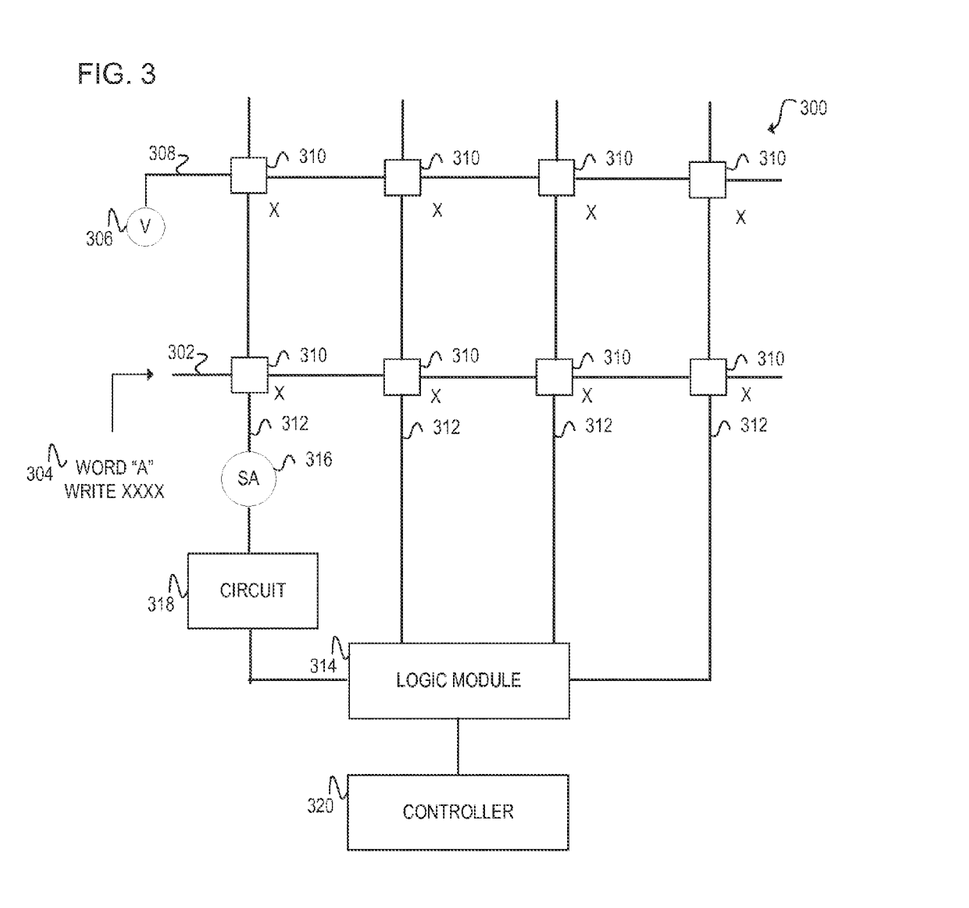
FIG. 3 is a block diagram of an example system including a crossbar memory with a first crossbar and a second crossbar, a current sense amplifier, logic module, and controller to read data values at an output line.

FIG. 3 is a block diagram of an example system including a crossbar memory 300 with a first crossbar 302 and a second crossbar 308 to write and activate data values to junctions 310, across each crossbar 302 and 308. The crossbar memory 300 further includes a current sense amplifier 316 and circuit 318 to convert the output from the current sense amplifier 316 to a digital logic level. Additionally, the crossbar memory 300 includes a logic module 314 to read data values at the output lines 312 and a controller 320 to return an address of the second crossbar 308 if the data values correspond to the data values across the first crossbar 302. The first crossbar 302, data values corresponding to a word 304, second crossbar 308, voltage source 306, junctions 310, output lines 312, and logic module 314 may be similar in structure and functionality to the first crossbar 102 and 202, data values corresponding to the word 104 and 204, second crossbar 108 and 208, voltage source 106 and 206, junctions 110 and 210, output lines 112 and 212, and logic module 114 and 214 as in FIGS. 1-2.

The current sense amplifier 312 is an electrical component that outputs a voltage to the circuit 318 which is proportional to the current on the output line 312. One implementation of the current sense amplifier 316, "SA," utilizes a current sense resistor to convert the input current to a proportional voltage which is amplified. The amplified voltage is the output from the sense amplifier 316 to the circuit 318. Although, FIG. 3 illustrates the sense amplifier 316 as a single component on the output line 312, examples should not be limited as this was done for illustration purposes to clarify the crossbar memory 300. For example, there may be multiple sense amplifiers 316 and circuit 318, each amplifier 316 and circuit 318 located on the output line 312 and connected to the logic module 314. In this example, each crossbar under test (i.e., the second crossbar 308) is done in a sequential manner if each of the multiple sense amplifiers 316 and circuit 318 are located on each output line 312. In a further example, the single sense amplifier 316 and circuit 318 within the crossbar memory 300 would connect to each output line 312 between the junction 310 and the logic module 314. In this example, it may take m cycles to write and activate each of the crossbars 302 and 308 plus n read cycles to test the crossbar memory 300.

The circuit 318 receives the output from the sense amplifier 316 and converts the voltage to a digital logic level (i.e., 0 or 1) as input to the logic module 314. In one implementation, the circuit 318 includes multiple comparators and an OR gate to convert the output from the current sense amplifier 316 to a digital logic level. In a further implementation, the circuit 318 includes an analog to digital converter. Yet, in a further implementation, the circuit 318 includes a counter to track the number of digital logic levels.

The controller 320 returns the location of the crossbar under test (i.e., the second crossbar 308) if the data values across both crossbars 302 and 308 correspond to one another. Examples of the controller 320 include a processor, microchip, chipset, electronic circuit, microprocessor, semiconductor, microcontroller, central processing unit (CPU), graphics processing unit (GPU), visual processing unit (VPU), or other programmable device capable of returning the location of the second crossbar 308 upon the correspondence of the data values in the first crossbar 302. For example, assume a user may want to find out the locations of the letter "t," thus the data values corresponding to "t," are written across the first crossbar 302 to the junctions 310; the voltage source 306 activates the data values across the second crossbar 308 to determine if the data values on both crossbars 302 and 308 correspond to one another; if the controller 320 determines there is correspondence, the controller will return the location of the second crossbar 308 to the user.

Figure 4:
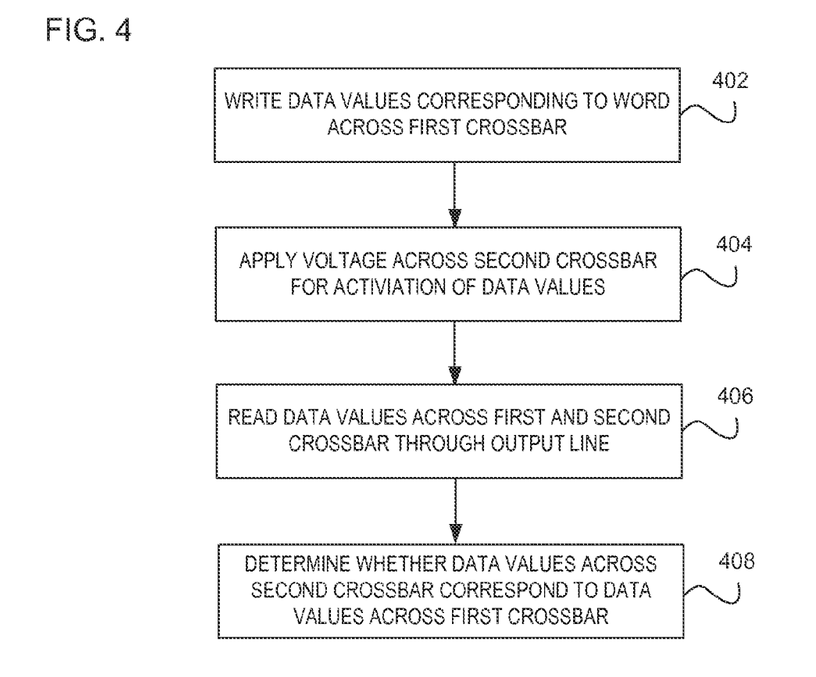
FIG. 4 is a flowchart of an example method to write data values corresponding to a word across a first crossbar, apply a voltage across a second crossbar to activate data values, and determine whether the data values across the second crossbar corresponds to the data values across the first crossbar.

FIG. 4 is a flowchart of an example method to write data values corresponding to a word across a first crossbar and apply a voltage across a second crossbar to activate the data values across the second crossbar. The method further reads the data values activated across the second crossbar and determines whether these data values correspond to the data values in the first crossbar. In discussing FIG. 4, reference may be made to the components in FIGS. 1-3 to provide contextual examples. FIG. 4 may be implemented on a controller such as circuit 318 in FIG. 3; however, it may be executed on other suitable components. For example, FIG. 4 may be implemented in the form of executable instructions on a machine readable storage medium.

At operation 402, data values corresponding to a word are written across the first crossbar. Operation 402 may include inputting a word into a computing device and converting the word into the data values that are written into the junctions across the first crossbar. In a contextual example, the data values may be written to junctions 110, 210, and 310 by applying voltage 106, 206, and 306 across the first crossbar 102, 202, and 302. Applying the voltage across the first crossbar, directs each of the junctions located across the first crossbar to store a data value. The data values stored in each of the junctions across the first crossbar correspond to a word. For example, assume the word "it," is converted to a type of character encoding scheme based on a language alphabet. In this example, the data values corresponding to this word in binary may include, "01101001 01110100." Each of the bits represent a high level (i.e., 1) or low level (i.e., 0) of voltage written into each of the junctions. In another implementation, as depicted in FIG. 2, the data values written into each of the junctions are binary data values that bitwise are the inverse of the data values representing the word. In a further implementation of operation 402, the first crossbar is a type of reference of data values for comparison amongst other crossbars to determine whether the other crossbars contain the corresponding word written across the first crossbar.

At operation 404, a voltage source applies voltage across the second crossbar for activation of the data values. The voltage source applied at operation 404 may be a lesser magnitude of voltage than the voltage applied at operation 402. The reason is the activation of the data values stored in each junction requires a lesser magnitude of voltage than to write data values to each junction. Writing the data values may consist of changing a state of the junction (e.g., from 0 to 1) which takes a higher magnitude of voltage.

At operation 406, an output line reads the data values across the first and the second crossbar. The output line intersects each of the crossbars at the junctions which store the data values. Operation 406 may include reading a voltage magnitude or a current magnitude through the output line by applying voltage through the crossbars as at operations 402-404. In a contextual example, the output line 312 includes the current sense amplifier 316 as in FIG. 3 and converts the current from the junction 310 to a voltage level which in turn is read as a high level or low level at the logic module 314.

At operation 408, a module determines whether the data values activated across the second crossbar at operation 404 corresponds to the data values written across the first crossbar at operation 402. The logic module 314 tracks the number of high levels and low levels (i.e., 1s and/or 0s) from the output lines 312 as in FIG. 3. The number of high and low levels are tracked by aggregating the current from the junctions 310 on each output line 312 which is read by the logic module 314. In operation 408, the current sense amplifier senses current from each junction and amplifies to a recognizable logic level of high or low so data can be interpreted properly at the controller. The controller 320 tracks whether the data values by the second crossbar correspond to the data values across the first crossbar. In another implementation, operation 408 includes a counter to track the binary bits from the current sense amplifier to determine whether the second crossbar data values correspond to the first crossbar data values. In a further implementation of operation 408, the controller 320 determines whether the second crossbar values correspond to the first crossbar values. Correspondence of data values between the first and the second crossbars enables the controller to determine whether the second crossbar is storing the word that is represented by the data values. Determining whether the data values across the second crossbar values correspond to the data values stored in the first crossbar enables the controller to identify which crossbar may contain the word corresponding to the data values stored in the first crossbar. Operation 408 may include the controller returning the address of the crossbar which contains the corresponding data values of the first crossbar. In this implementation, the controller tracks the location of each crossbar that may be analyzed against the first crossbar to determine which location of each crossbar may contain the similar data values corresponding to the word as the first crossbar. If the controller determines there is correspondence against the analyzed crossbar and the first crossbar (i.e., reference crossbar), the controller may return the address of the analyzed crossbar. This enables a type of content addressable functionality.

Figure 5:
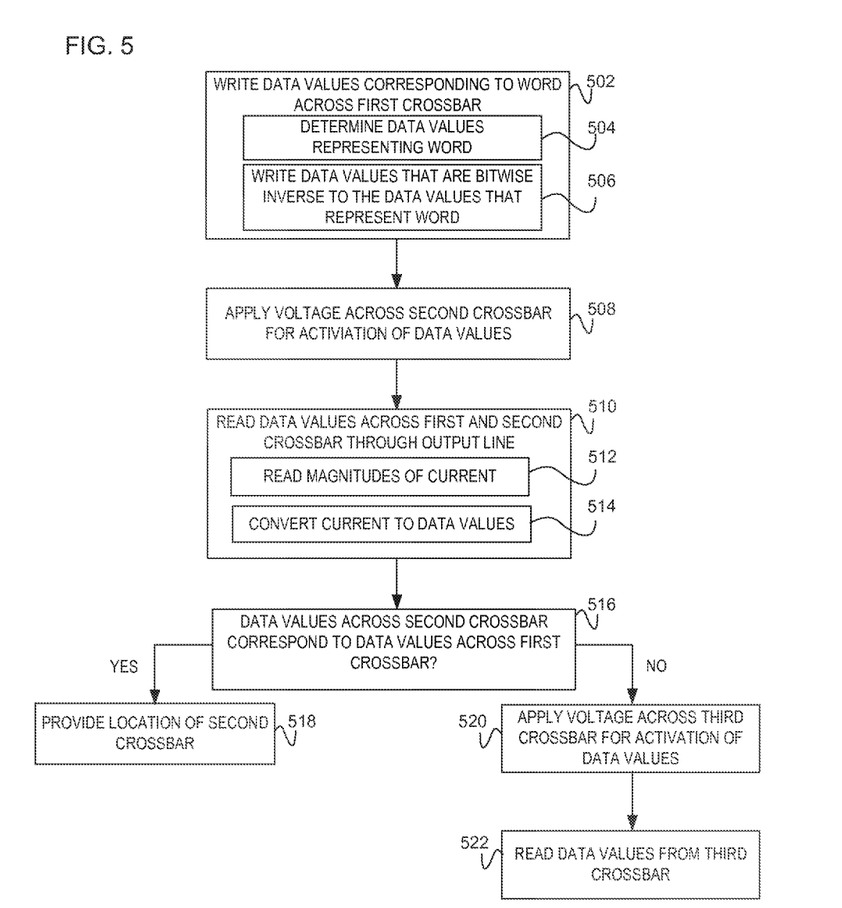
FIG. 5 is a block diagram of an example method to write data values corresponding to a word across a first crossbar, determine whether data values across a second crossbar correspond to data values across the first crossbar, and to provide a location of the second crossbar.

FIG. 5 is a flowchart of an example method to write data values corresponding to a word across a first crossbar and determine whether the data values across a second crossbar correspond to the data values across the first crossbar. Additionally, the method provides a location of the second crossbar if the data values across the second crossbar correspond to the data values across the first crossbar. Otherwise, the method applies a voltage across a third crossbar to activate data values for analysis. In discussing FIG. 5, reference may be made to the components in FIGS. 1-3 to provide contextual examples. Additionally, FIG. 5 may be implemented on a controller such as circuit 318 in FIG. 3; however, it may be executed on other suitable components. For example, FIG. 5 may be implemented in the form of executable instructions on a machine readable storage medium.

At operations 502, a voltage source applies an electrical charge across the first crossbar to write data values corresponding to a word at the junctions. Operation 502 may include operation 504 for determining the data values which represent the word. Operation 504 may include converting the word or letter into data values. In a further implementation, operation 502 may include operation 506 to write data values that are bitwise the inverse of the data values that represent the word at operation 504. Operation 502 may be similar in functionality to operation 402 as in FIG. 4.

At operation 508, the voltage source applies voltage across the second crossbar for activation of the data values at the junctions. The second crossbar may be considered the crossbar under test as the voltage applied across the second crossbar activates the data values for analysis at operation 516. Operation 508 may be similar in functionality to operation 404 as in FIG. 4.

At operation 510, the data values activated across the second crossbar at operation 508 may be read through the output lines. As such, operation 510 may include operations 512-514 to read a magnitude of current from the junctions across the crossbars and convert the current to digital logic levels. Operation 510 may be similar in functionality to operation 406 as in FIG. 4.

At operation 516, a controller and/or logic module determines whether the data values across the second crossbar correspond to the data values across the first crossbar. Operation 516 may include two separate methods depending on whether the data values have correspondence. For example, if it is determined the data values across the second crossbar correspond to the data values across the first crossbar, the method moves onto operation 518. If it is determined the data values across the second crossbar are without correspondence, the method moves to operations 520-522. Operation 516 may be similar in functionality to operation 408 as in FIG. 4.

At operation 518, a controller returns the location of the second crossbar as correspondence between the data values on both crossbars indicates the word or letter is stored at that particular crossbar. Returning the address of the particular crossbar provides the content addressable functionality.

At operations 520-522 if the data values across the second crossbar are determined to be without correspondence, the method moves onto the next crossbar to test for the data values. In operations 520, the voltage source applies voltage across a third crossbar to activate data values and reads the data values from the third crossbar.

In summary, examples disclosed herein disclose a more efficient memory that provides the content addressable functionality without additional circuitry and cost.

We claim:

1. A crossbar memory to provide content-addressable functionality, the crossbar memory comprising:
a first crossbar to write data values corresponding to a word;
a second crossbar, substantially parallel to the first crossbar, to receive voltage for activation of data values across the second crossbar;
an output line, that interconnects with the crossbars at junctions, to read the data values at the junctions; and
a logic module to determine whether the second crossbar data values correspond to the word written in the first crossbar,
wherein the crossbar memory includes m number of crossbars and activates data values sequentially through m−1 number of crossbars to determine whether each of the m−1 number of crossbars correspond to the data values across the first crossbar, the data values across the first crossbar corresponding to the word.

2. The crossbar memory of claim 1 wherein the junctions that interconnect the output line and the crossbars are memristors to store the data values across the first and the second crossbar.

3. The crossbar memory of claim 1 wherein the first crossbar contains binary data values that are a bitwise inverse of the data values that represent the word.

4. The crossbar memory of claim 1 wherein the logic module includes circuitry to read a current corresponding to the data values.

5. A method of providing content addressable function in a crossbar memory, the method comprising:
writing data values corresponding to a word across a first crossbar;
applying voltage across a second crossbar for activation of data values across the second crossbar;
reading the data values across the first and the second crossbar through an output line that interconnects with the crossbars at the junctions;
determining whether the data values across the second crossbar correspond to the data values corresponding to the word in the first crossbar;
determining the data values representing the word; and
writing the data values that are a bitwise inverse to the data values that represent the word.

6. The method of claim 5 wherein if the data values across the second crossbar correspond to the data values corresponding to the word in the first crossbar, the method is further comprising:
providing a location of the second crossbar.

7. The method of claim 5 wherein if the data values across the second crossbar do not correspond to the data values in the first crossbar, the method is further comprising:
applying voltage across third crossbar for activation of data values across the third crossbar;
reading the data values across the first and the third crossbar to determine whether the data values third crossbar correspond to the data values in the first crossbar.

8. The method of claim 5 wherein reading the data values across the first and the second crossbar is further comprising:
reading magnitudes of current corresponding to the data values across the crossbars; and
converting the magnitudes of current to the data values.

9. The method of claim 5 further comprising:
applying voltage across m number of crossbars for activation of data values across each of the m number of crossbars;

reading the data values across each of the m number of crossbars through n number of output lines; and determining whether the data values for each of the m number of crossbars correspond to the data values corresponding to the word in the first crossbar.

10. A system to provide content-addressability functionality in a crossbar memory, the system comprising:

the crossbar memory including;

a first crossbar to write data values corresponding to a word;

a second crossbar, substantially parallel to the first crossbar, to receive voltage for activation of data values across the second crossbar;

junctions, across the first crossbar and the second crossbar, to interconnect an output line to the first and the second crossbar, the junctions store data values across the first and the second crossbars;

an output line, that interconnects with the first and the second crossbar at the junctions, to read the data values of the junctions;

a logic module coupled to the output line to determine whether the data values across the second crossbar correspond to the data values corresponding to the word across the first crossbar; and a current sense amplifier coupled to the output line to measure current from each of the junctions, the current sense amplifier converts the current to voltage levels, each voltage level corresponding to each of the data values at each of the junctions.

11. The system of claim 10 further comprising a circuit coupled to the current sense amplifier to convert the voltage level to a digital logic value.

12. The system of claim 10 further comprising:

a controller coupled to the logic module and the crossbars to return an address of the second crossbar if the second crossbar data values correspond to the data values in the first crossbar.

* * * * *